US010574012B2

(12) United States Patent
Matsuo et al.

(10) Patent No.: US 10,574,012 B2
(45) Date of Patent: Feb. 25, 2020

(54) ROTATABLE CONNECTOR DEVICE

(71) Applicants: Furukawa Electric Co., Ltd., Tokyo (JP); Furukawa Automotive Systems Inc., Shiga (JP)

(72) Inventors: Ryosuke Matsuo, Tokyo (JP); Kengo Mitose, Tokyo (JP)

(73) Assignees: Furukawa Electric Co., Ltd., Tokyo (JP); Furukawa Automotive Systems Inc., Shiga (JP)

( * ) Notice: Subject to any disclaimer, the term of this patent is extended or adjusted under 35 U.S.C. 154(b) by 0 days.

(21) Appl. No.: 15/957,500

(22) Filed: Apr. 19, 2018

(65) Prior Publication Data

US 2018/0241165 A1 Aug. 23, 2018

Related U.S. Application Data

(63) Continuation of application No. PCT/JP2017/025927, filed on Jul. 18, 2017.

(30) Foreign Application Priority Data

Aug. 16, 2016 (JP) .................................. 2016-159698

(51) Int. Cl.
*H01R 35/04* (2006.01)
*B60R 16/027* (2006.01)
(Continued)

(52) U.S. Cl.
CPC ........... *H01R 35/04* (2013.01); *B60R 16/027* (2013.01); *C22C 9/02* (2013.01); *C22C 9/06* (2013.01);
(Continued)

(58) Field of Classification Search
CPC ...... H01R 35/04; H01R 35/025; H05K 1/028; H01B 7/0838
See application file for complete search history.

(56) References Cited

U.S. PATENT DOCUMENTS

| 6,518,503 | B1* | 2/2003 | Yamanobe | ........... | H01B 7/0838 |
| | | | | | 174/117 FF |
| 9,457,389 | B2 | 10/2016 | Yoshida et al. | | |
| 2003/0019659 | A1* | 1/2003 | Yamanobe | ........... | H01B 7/0838 |
| | | | | | 174/117 FF |

FOREIGN PATENT DOCUMENTS

| JP | H11286760 A | 10/1999 |
| JP | 3633302 B2 | 3/2005 |

(Continued)

OTHER PUBLICATIONS

International Search Report and Written Opinion dated Oct. 17, 2017 for PCT Application No. PCT/JP2017/025927 (English translation of ISR only).

(Continued)

*Primary Examiner* — Tho D Ta
(74) *Attorney, Agent, or Firm* — Dorsey & Whitney LLP

(57) ABSTRACT

A rotatable connector device includes a stationary member, a rotatable member rotatably attached thereto, and a flat cable housed in an annular space between the stationary and rotatable members. One end of the flat cable is connected to a stationary-side connector fixed to the stationary member, and another end of the flat cable is connected to a rotating-side connector fixed to the rotatable member. The flat cable includes a folded-back portion bent and folded back at a middle section in a longitudinal direction thereof. The flat cable includes a predetermined number of conductor/conductors each comprising a copper alloy and wound up or rewound with bending kept at the folded-back portion. Each conductor satisfies $Y \geq 14.175X^2 - 249.35X + 1406.9$ for a bending radius of 4 to 8 mm, where X denotes bending radius, and Y denotes 0.2% yield stress, and has an electrical conductivity of 50% IACS or greater.

6 Claims, 3 Drawing Sheets

(51) Int. Cl.
*H01B 7/08* (2006.01)
*H01R 13/03* (2006.01)
*C22C 9/02* (2006.01)
*C22C 9/06* (2006.01)
*C22F 1/08* (2006.01)
*H01B 1/02* (2006.01)
*H01B 13/00* (2006.01)
*H01R 35/02* (2006.01)
*H05K 1/02* (2006.01)
*B60R 21/017* (2006.01)

(52) U.S. Cl.
CPC ............... *C22F 1/08* (2013.01); *H01B 1/026* (2013.01); *H01B 7/08* (2013.01); *H01B 13/0016* (2013.01); *H01B 13/0036* (2013.01); *H01R 13/03* (2013.01); *B60R 21/017* (2013.01); *H01B 7/0823* (2013.01); *H01B 7/0838* (2013.01); *H01R 35/025* (2013.01); *H01R 2201/26* (2013.01); *H05K 1/028* (2013.01)

(56) References Cited

FOREIGN PATENT DOCUMENTS

| JP | 4193381 B2 | 12/2008 |
| JP | 4734695 B2 | 7/2011 |
| JP | 5342712 B1 | 11/2013 |

OTHER PUBLICATIONS

English Translation of International Preliminary Report on Patentability Chapter I (PCT/IB/373) dated Feb. 19, 2019 for PCT Application No. PCT/JP2017/025927, 8 pages.

English Translation of the Written Opinion of the International Search Authority (PCT/ISA/237) dated Dec. 14, 2018 for PCT Application No. PCT/JP2017/025927, 7 pages.

\* cited by examiner

ROTATABLE CONNECTOR DEVICE

CROSS REFERENCE TO RELATED APPLICATIONS

This is a continuation application of International Patent Application No. PCT/JP2017/025927 filed Jul. 18, 2017, which claims the benefit of Japanese Patent Application No. 2016-159698, filed Aug. 16, 2016. The priority applications are hereby incorporated by reference in their entirety for any purpose.

TECHNICAL FIELD

The present disclosure relates to a rotatable connector device that houses a flat cable, and more particularly relates to a rotatable connector device that is mounted to a vehicle.

BACKGROUND

In the related art, in a vehicle such as a four-wheel vehicle, a rotatable connector device (SRC: Steering Roll Connector) for supplying power to an airbag device and other devices is mounted in a coupling portion between a steering wheel for steering and a steering shaft. The rotatable connector device includes a stator, a rotator that is assembled to the stator in a freely rotatable manner, and a flexible flat cable (FFC) that is wound and housed in an annular internal space formed by the stator and the rotator, and an end portion of the FFC includes a connecting structure that electrically connects the FFC and an outside.

The FFC includes a plurality of conductors that are arranged in parallel, a pair of insulating films that are arranged so as to sandwich the plurality of conductors, and an adhesive layer provided between the pair of insulating films, and has a laminated structure formed by the above plurality of conductors, the pair of insulating films and the adhesive layer. The conductors are made of, for example, a tough pitch copper, an oxygen-free copper, or the like. In addition, the insulating films each include an adhesive layer that is made of a polyester-based, polyurethane-based, polyamide-based, or polystyrene-based resin, and by bonding the above pair of insulating films with the adhesive layers interposed therebetween and with the plurality of conductors sandwiched therebetween, the conductors are insulated from each other, or the conductors are insulated from an outside.

As the above conductors, for example, there is proposed a conductor for a flat cable that is made of a tough pitch copper or the like and in which occurrence of a crack is suppressed even when bending deformation is repeatedly applied with a bending radius of about 8 mm (Japanese Patent No. 5342712).

As another conductor, there is proposed a conductor for a flat cable made of a copper alloy to which one or more kinds of B, Sn, In, and Mg are added at 0.005% to 0.045% in total, and in which crystal grains are refined to 7 μm or smaller (Japanese Patent No. 3633302).

There is proposed a flat conductor obtained by performing heat treatment on a flat-shaped conductor that includes a base metal being a copper alloy that is an oxygen-free copper (99.999 wt % Cu) to which 0.3 wt % or less of Sn and 0.3 wt % or less of In or Mg is added, or being a copper alloy that is an oxygen-free copper (99.999 wt % Cu) to which 10 wt % or less of Ag is added and that includes a surface on which Sn is plated, the flat conductor having a tensile strength of 350 MPa or higher, an elongation of 5% or more, and an electrical conductivity of 70% IACS or higher (Japanese Patent No. 4734695).

In the technique of Japanese Patent No. 5342712, however, in order to maintain a bending property of the conductor, the bending radius needs to be about 8 mm, so that reduction of a rotatable connector device in size cannot be achieved, and on the other hand, in a case where the rotatable connector device is reduced in size, sufficient elasticity and bending property cannot be obtained. In particular, in a flat cable using a conductor made of a tough pitch copper of the related art, a sufficient elasticity is not obtained by reduction in size, and it is thus difficult to wind up or rewind the flat cable. In addition, because the bending property is poor, a lifetime required for the rotatable connector device is not achieved, and signal transmission by the conductor cannot be performed sufficiently.

In addition, in the technique of Japanese Patent No. 3633302, by merely performing grain size control by defining the kind and content of additional elements in the copper alloy, a bending property of the conductor is insufficient.

Moreover, in the technique of Japanese Patent No. 4734695, although it is described that an elongation of 5% or greater is essential, and when the elongation is out of the range, the rigidity is high, which makes it difficult to fold or bend the conductor and may cause the conductor to buckle when folding or bending the conductor, it is revealed that a bending property of the conductor is insufficient even when the elongation is 5% or greater. In particular, in recent years, with the development of automobiles having higher performance and higher functions, improvement in durabilities of various devices installed in an automobile is required from the viewpoint of improvement of reliability, safety, and the like, and further improvement of the bending property of the flat cable in a rotatable connector device is required.

SUMMARY

The present disclosure is related to providing a rotatable connector device including a flat cable that exerts a sufficient elasticity while maintaining a high electrical conductivity, so as to achieve further improvement in a bending property.

The present inventor carried out assiduous studies, and as a result, found a relationship between a bending radius of a flat cable and a 0.2% yield stress of the flat cable at a time when a predetermined number of bendings to break is exceeded, and also found that, by defining additional elements and a range of content of each of the elements in a copper alloy and by applying strengthening mechanisms including solid-solution, precipitation, grain refining, and working, a sufficient elasticity can be obtained and a bending property can be further improved.

Here, the sufficient elasticity refers to being likely to be deformed moderately, and has a good resiliency from the deformation. For example, having a 0.2% yield stress that becomes not less than 80% after 1000000 times of bendings refers to having a sufficient elasticity.

According to a first aspect of the present disclosure, a rotatable connector device may include a stationary member, a rotatable member rotatably attached to the stationary member, and a flat cable housed in an annular space between the stationary member and the rotatable member, one end of the flat cable being connected to a stationary-side connector that is fixed to the stationary member, another end of the flat cable being connected to a rotating-side connector that is fixed to the rotatable member, the flat cable being provided with a folded-back portion at a middle section in a longitudinal direction of the flat cable, the folded-back portion being bent and folded back, the flat cable including a predetermined number of one or more conductors each made of a copper alloy and is wound up or rewound with bending kept at the folded-back portion, the conductors each satisfying $Y \geq 14.175X^2 - 249.35X + 1406.9$ within a range of bending radius of 4 mm to 8 mm, where X denotes bending radius, and Y denotes 0.2% yield stress, the conductors each having an electrical conductivity of greater than or equal to 50% IACS. According to a second aspect of the present disclosure, a method for manufacturing conductors included in a flat cable of the rotatable connector device is provided, the rotatable connector device may include a stationary member, a rotatable member rotatably attached to the stationary member, and a flat cable housed in an annular space between the stationary member and the rotatable member, one end of the flat cable being connected to a stationary-side connector that is fixed to the stationary member, another end of the flat cable being connected to a rotating-side connector that is fixed to the rotatable member, the flat cable being provided with a folded-back portion at a middle section in a longitudinal direction of the flat cable, the folded-back portion being bent and folded back, the flat cable including a predetermined number of one or more conductors each made of a copper alloy and is wound up or rewound with bending kept at the folded-back portion, the conductors each satisfying $Y \geq 14.175X^2 - 249.35X + 1406.9$ within a range of bending radius of 4 mm to 8 mm, where X denotes bending radius, and Y denotes 0.2% yield stress, the conductors each having an electrical conductivity of greater than or equal to 50% IACS, the method including:

melting and casting; hot working; cold working; heat treatment; and finishing, in this order, the heat treatment being performed at a heating temperature of 250 to 600° C., for a heating duration of 10 minutes to 5 hours.

With the rotatable connector device according to the present disclosure, it may be possible to obtain a sufficient elasticity even in a case where the rotatable connector device is reduced in size while maintaining a high electrical conductivity. In addition, by providing a folded-back portion that is bent and folded back, it is possible to wind up or rewind the flat cable with a fold back having a bending radius kept at 4 mm to 8 mm, when the rotatable member rotates clockwise or counterclockwise.

In addition, a copper alloy subjected to microstructure control may also contributes to the improvement of the bending property, and thus a fatigue property required for the rotatable connector device is satisfied. Therefore, in a case where a steering wheel is steered in a vehicle and the flat cable is repeatedly subjected to bending movement with a clockwise rotation or a counterclockwise rotation of the steering wheel, it is possible to further improve the bending property of the flat cable and it is possible to prevent a rupture of the flat cable. Thus, a flat cable having improved bending life, as well as improved reliability and safety can be provided.

Moreover, by using a copper alloy different from a tough pitch copper of the related art for the rotatable connector device, it may be possible to narrow widths of the conductors in the flat cable, satisfy a required bending life even with a small bending radius, reduce the rotatable connector device in size, which cannot be achieved by a copper alloy having a composition of the related art, and to implement thickness reduction and multichannel of the rotatable connector device by narrowing widths of the conductors utilizing an excellent bending property.

DETAILED DESCRIPTION

Further features of the present disclosure will become apparent from the following detailed description of exemplary embodiments with reference to the accompanying drawings.

[Configuration of Rotatable Connector Device]

Figure 1:
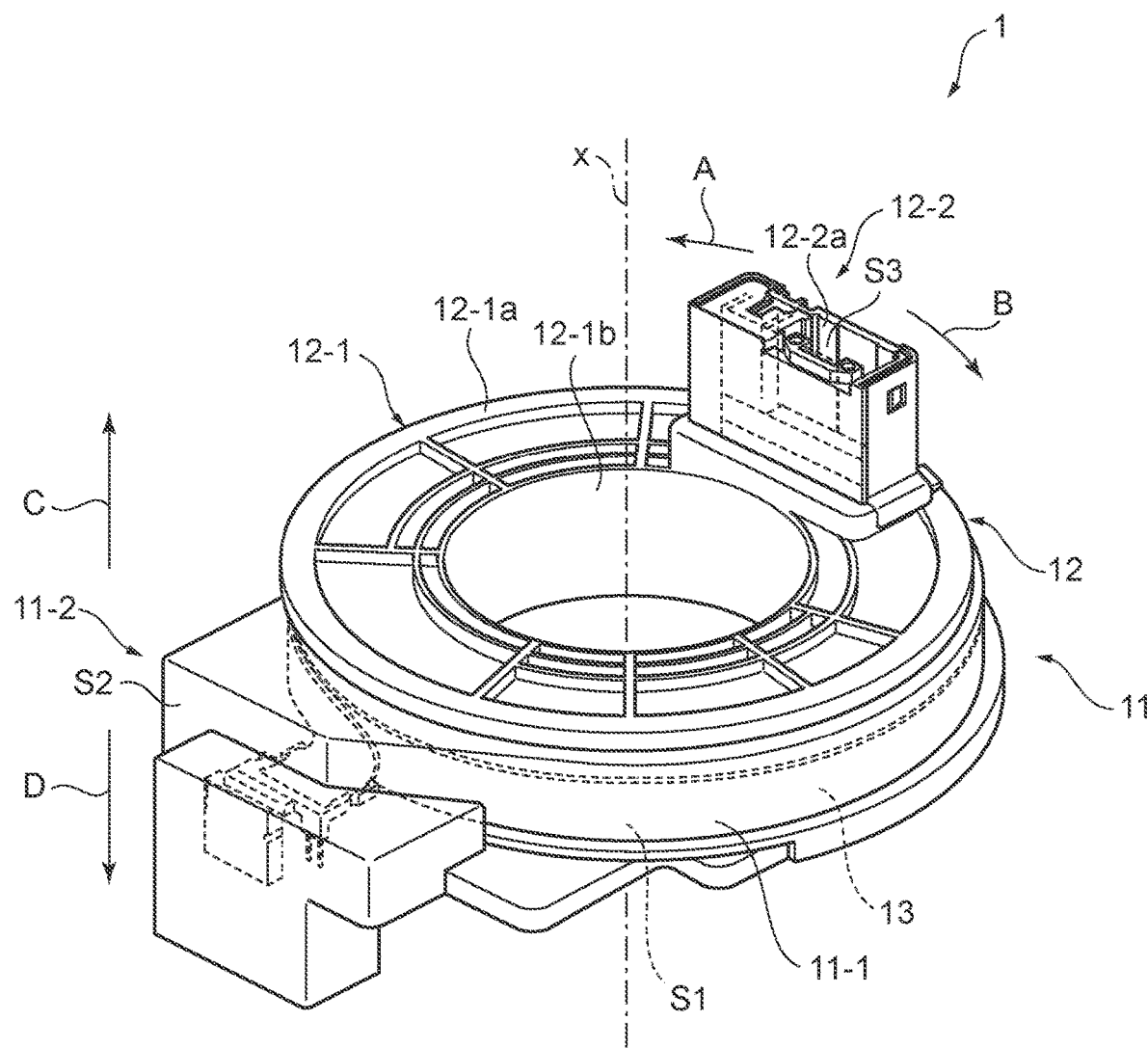
FIG. 1 is a perspective view schematically illustrating a configuration of a rotatable connector device according to an embodiment of the present disclosure.

FIG. 1 is a perspective view schematically illustrating a configuration of a rotatable connector device according to an embodiment of the present disclosure.

As illustrated in FIG. 1, a rotatable connector device 1 includes a stator 11 (stationary member), a rotator 12 (rotatable member) attached to the stator 11 in such a manner as to be rotatable about an axis x, and a flat cable 13 housed in an annular space S1 between the stator 11 and the rotator 12. As for a vehicle, the stator 11 is fixed to a body of the vehicle, and the rotator 12 is attached to a steering wheel.

The stator 11 includes a stator body 11-1 having an annular or substantially annular shape about the axis x with an engagement hole (not illustrated) having a circular shape about the axis x, and a stator-side connector housing portion 11-2 forming a stator-side connector housing space S2.

The engagement hole formed in the stator body 11-1 may be formed in such a manner as to house an end portion of a cylinder portion of the rotator 12 on a lower side (in an arrow D direction in FIG. 1) of the cylinder portion, which will be described later, and to be engageable with this end portion.

The rotator 12 includes a rotator body 12-1 provided around the axis x (in an arrow A direction and an arrow B direction in FIG. 1) and having in an annular shape, and a rotator-side connector housing portion 12-2 allowing the annular space S1 and an outside to communicate with each other and demarcating a rotator-side connector housing space S3.

The rotator body 12-1 may include a top panel portion 12-1a having a hollow disc shape or a substantially hollow disc shape about the axis x, and a cylinder portion 12-1b extending along the axis x from an inner periphery-side end portion of the top panel portion 12-1a to an annular space S1 side. The top panel portion 12-1a defines a portion facing an upper side (in an arrow C direction in FIG. 1) in the rotatable connector device 1. The cylinder portion 12-1b is formed in such a manner as to engage a corresponding portion of the stator 11 pivotably about the axis x.

When the above rotator 12 is attached to the stator 11, the top panel portion 12-1a and the cylinder portion 12-1b of the rotator 12, and the stator body 11-1 of the stator 11 demarcate the annular space S1. The rotator 12 is pivotably engaged in the engagement hole of the stator body 11-1 of the stator 11 at a lower-side end portion of the cylinder portion 12-1b of the cylinder portion 12-1b, and with engagement, the rotator 12 is pivotably held by the stator 11.

In the stator-side connector housing space S2 in the stator-side connector housing portion 11-2, one end of the flat cable 13 drawn out of the annular space S1 is inserted. The stator-side connector housing portion 11-2 is also provided with a stationary-side terminal insertion hole (not illustrated) into which a stator-side connector (stationary-side connector) can be inserted. The stator-side connector has a predetermined shape and is connected to a wiring harness forming an electric circuit on a vehicle body side. When the stator-side connector is mounted to the stator-side connector housing portion 11-2, the one end of the flat cable 13 is connected to the stator-side connector fixed to the stator 11.

In the rotator-side connector housing space S3 of the rotator-side connector housing portion 12-2, another end of the flat cable 13 drawn out of the annular space S1 is inserted, in a similar manner as the above stator-side connector housing space S2. The rotator-side connector housing portion 12-2 is also provided with a rotating-side terminal insertion hole 12-2a into which a rotator-side connector (rotating-side connector) of a cable drawn out of an electrical component (e.g., a horn switch, an airbag module, etc.) of in a steering wheel can be inserted. When the stator-side connector is mounted to the rotator-side connector housing portion 12-2, the other end of the flat cable 13 is connected to the stator-side connector fixed to the rotator 12.

The flat cable 13 is wound in the annular space S1 in such a manner as to have a slack of an appropriate length, and the length of the slack varies as the rotator 12 rotates with respect to the stator 11. A plurality of flat cables 13 can be held in such a manner as to be always regularly arranged in the annular space S1 so as to follow the variation of the length of the slack.

Figure 2:
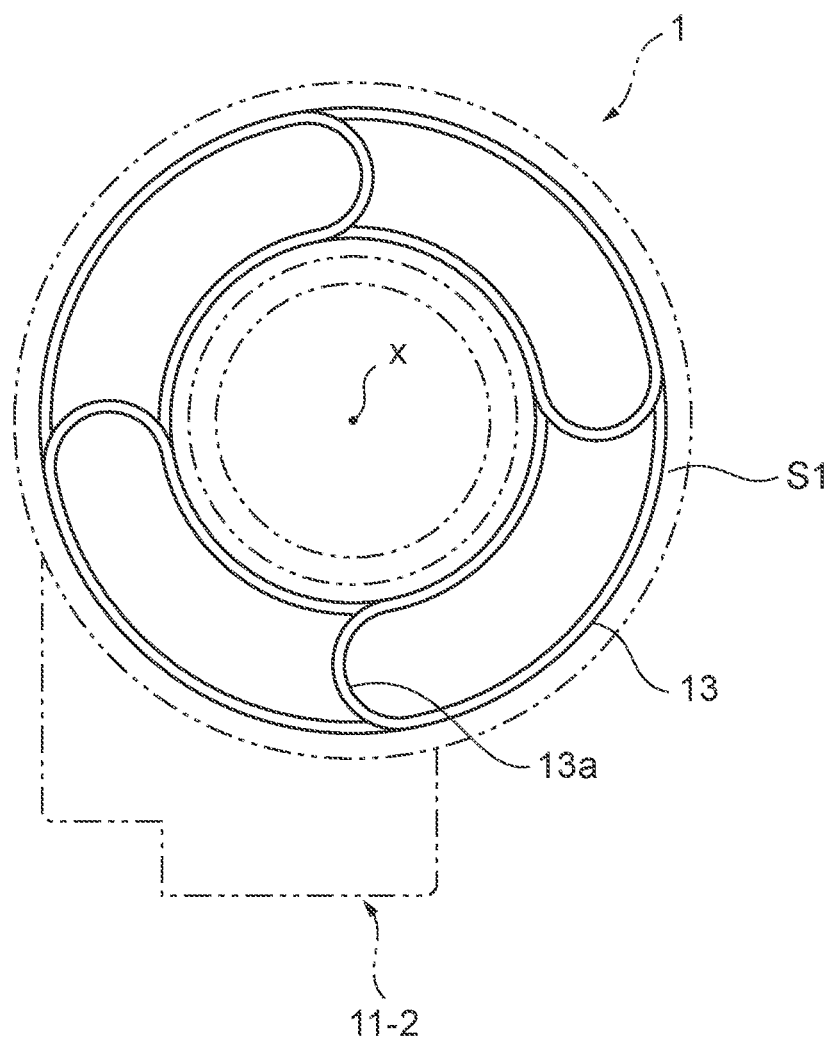
FIG. 2 is a schematic diagram illustrating how a flat cable in FIG. 1 is housed in an annular space of a rotatable connector device.

As illustrated in FIG. 2, the flat cable 13 has, in the annular space S1, a folded-back portion 13a at which the flat cable 13 is bent and folded back at a middle section in a longitudinal direction of the flat cable 13. The plurality of flat cables 13 each including the above folded-back portion 13a are disposed around the axis x. A bending radius of the folded-back portion 13a is 4 mm to 8 mm, preferably 4.0 mm to 6.5 mm, and more preferably 4 mm to 5 mm. The flat cable 13 is wound up or rewound with the bending kept at the folded-back portion 13a as the rotator 12 rotates clockwise or counterclockwise. In FIG. 2, four flat cables 13 are disposed, but the number of flat cables 13 is not limited to four, and a predetermined number of flat cables 13 may be disposed. In addition, one or two of the four flat cables illustrated FIG. 2 may be dummy cables (resin films without conductors).

With the above configuration, an electrical component such as an airbag module on a steering wheel side and the electric circuit on the vehicle body side are electrically connected via the flat cables 13. This connection allows power supply or signal transmission in the rotatable connector device 1.

[Configuration of Flat Cable]

Figure 3:
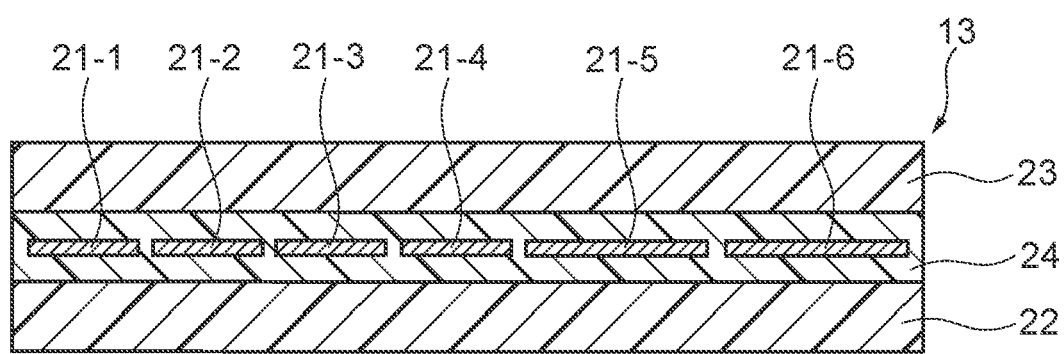
FIG. 3 is a width-direction cross-sectional view illustrating a configuration of a flat cable in FIG. 2.

The flat cable 13 of the present embodiment may include, as illustrated in FIG. 3, a predetermined number of conductors 21-1, 21-2, 21-3, 21-4, 21-5, and 21-6 made of, for example, a copper alloy, a pair of insulating films 22 and 23 disposed in such a manner as to sandwich the plurality of conductors, and an adhesive layer 24 provided between the pair of insulating films. The flat cables 1 of the present embodiment are each, for example, a flexible flat cable (FFC).

The conductors 21-1 to 21-6 may be arranged in such a manner that in-plane directions of rolling surfaces of the conductors are substantially the same with the insulating film 22 being provided on one rolling surface of each of these conductors and the insulating film 23 being provided on the other rolling surface of each of these conductors. The conductors 21-1 to 21-6 are 0.1 mm to 15 mm in width, preferably 0.3 mm to 15 mm in width, more preferably 0.3 mm to 0.5 mm in width, and 0.02 mm to 0.05 mm in thickness, preferably 0.030 mm to 0.039 mm in thickness. Width-direction cross-sectional areas of the conductors 21-1 to 21-6 are each 0.75 mm$^2$ or smaller, preferably 0.02 mm$^2$ or smaller.

The adhesive layer 24 has a thickness sufficient for embedding the conductors 21-1 to 21-6 and is sandwiched by the pair of insulating films 22 and 23. The adhesive layer 24 is made of a well-known adhesive applicable to the pair of insulating films 22 and 23.

The pair of insulating films 22 and 23 are made of a resin capable of exhibiting a good adhesiveness property to the adhesive layer 24 and/or the conductors 21-1 to 21-6. As a suitable example, the pair of insulating films 22 and 23 may be each made up of two layers: an outer-most layer made of a polyethylene terephthalate, which has a melting point of 200° C. or higher so as not to melt when adhesive layers on the pair of insulating films 22 and 23 are fused; and an adhesive layer made of a polyester-based resin. The pair of insulating films 22 and 23 are, for example, 6 mm to 15 mm in width and 0.01 mm to 0.05 mm in thickness.

[Chemical Composition of Conductors]

The conductors may each contain one or more of 0.1 to 0.8 mass % of tin (Sn), 0.05 to 0.8 mass % of magnesium (Mg), 0.01 to 0.5 mass % of chromium (Cr), 0.1 to 5.0 mass % of zinc (Zn), 0.02 to 0.3 mass % of titanium (Ti), 0.01 to 0.2 mass % of zirconium (Zr), 0.01 to 3.0 mass % of iron (Fe), 0.001 to 0.2 mass % of phosphorus (P), 0.01 to 0.3 mass % of silicon (Si), 0.01 to 0.3 mass % of silver (Ag), and 0.1 to 1.0 mass % of nickel (Ni), with a balance comprising or consisting of copper (Cu) and inevitable impurities.

In addition, the conductors each may preferably contain 0.06 to 0.14 mass % of magnesium, and 0.225 to 0.3 mass % of chromium, with the balance comprising or consisting of copper and inevitable impurities.

<Tin: 0.1 to 0.8 Mass %>

Tin is an element having a function of high strengthening when added and solid-solved in copper. With a content of tin of less than 0.1 mass %, the effect is insufficient, and with a content of tin of more than 0.8 mass %, it is difficult to keep an electrical conductivity at greater than or equal to 50%. The content of tin is therefore 0.1 to 0.8 mass % in the present embodiment.

<Magnesium: 0.05 to 0.8 Mass %>

Magnesium is an element having a function of high strengthening when added and solid-solved in copper. With a content of magnesium of less than 0.05 mass %, the effect may be insufficient, and with a content of magnesium of more than 0.8 mass %, it may be difficult to keep an electrical conductivity of the conductors at greater than or equal to 50%. The content of magnesium may therefore be 0.05 to 0.8 mass % in the present embodiment. In addition, the content of magnesium may preferably be 0.06 to 0.14 mass %. With the content of magnesium within a range of 0.06 to 0.14 mass %, it is possible to increase a solid-solution strengthening capability that brings a high bendability, while keeping a high electrical conductivity.

<Chromium: 0.01 to 0.5 Mass %>

Chromium is an element having a function of high strengthening when added and solid-solved in copper, and thereafter finely precipitated. With a content of chromium of less than 0.01 mass %, precipitation hardening may not be expected and a yield stress is insufficient, and with a content of chromium of more than 0.5 mass %, crystallized grains and coarse precipitates develop, causing degradation in fatigue property, which is inappropriate. The content of chromium may therefore be 0.01 to 0.5 mass % in the present embodiment.

In addition, the content of chromium may preferably be 0.225 to 0.3 mass %. With the content of chromium being within a range of 0.225 to 0.3 mass %, it is possible to increase a precipitation strengthening ability that causes a high bendability and to minimize crystallized grains and coarse precipitates formed in casting or hot rolling and having an adverse effect on a bendability.

<Zinc: 0.1 to 5.0 Mass %>

Zinc is an element having a function of high strengthening when added and solid-solved in copper. With a content of zinc of less than 0.1 mass %, solid-solution hardening cannot be expected and a yield stress is insufficient, and with a content of zinc of more than 5.0 mass %, it is difficult to keep the electrical conductivity at greater than or equal to 50%. The content of zinc may therefore be 0.1 to 5.0 mass % in the present embodiment.

<Titanium: 0.02 to 0.3 Mass %>

Titanium is an element having a function of high strengthening when added and solid-solved in copper, and thereafter precipitating finely. With a content of titanium of less than 0.02 mass %, precipitation hardening cannot be expected and a yield stress is insufficient, and with a content of titanium of more than 0.3, it is difficult to keep the electrical conductivity at greater than or equal to 50% IACS, causes coarse crystallized grains and precipitates to develop, causing degradation in fatigue property, which is inappropriate, and results in a significantly poor productivity. The content of titanium may therefore be 0.02 to 0.3 mass % in the present embodiment.

<Zirconium: 0.01 to 0.2 Mass %>

Zirconium is an element having a function of high strengthening when added and solid-solved in copper, and thereafter finely precipitated. With a content of zirconium of less than 0.01 mass %, precipitation hardening cannot be expected and a yield stress is insufficient, and a content of zirconium more than 0.2 mass % causes coarse crystallized grains and precipitates to develop, causing degradation in fatigue property, which is inappropriate, and results in a significantly poor productivity. The content of zirconium may therefore be 0.01 to 0.2 mass % in the present embodiment.

<Iron: 0.01 to 3.0 Mass %>

Iron is an element having a function of high strengthening when added and solid-solved in copper, and thereafter finely precipitating. With the content of iron of less than 0.01 mass %, precipitation hardening cannot be expected and a yield stress is insufficient, and with a content of iron of more than 3.0 mass %, it is difficult to keep the electrical conductivity at greater than or equal to 50% IACS. The content of iron may therefore be 0.01 to 3.0 mass % in the present embodiment.

<Phosphorus: 0.001 to 0.2 Mass %>

Phosphorus is an element having a function of deoxidation and an element that improves not properties but the productivity. With a content of phosphorus of less than 0.001 mass %, an improvement effect in terms of production is insufficient, and with a content of phosphorus of more than 0.2 mass %, it is difficult to keep the electrical conductivity at greater than or equal to 50% IACS. The content of phosphorus may therefore be 0.001 to 0.2 mass % in the present embodiment.

<Silicon: 0.01 to 0.3 Mass %>

Silicon is an element having a function of precipitation strengthening when forming compounds with additional elements such as chromium and nickel. A content of silicon less than 0.01 mass % makes the effect insufficient, and a content of silicon more than 0.3 mass % makes it difficult to keep the electrical conductivity at greater than or equal to 50% IACS. The content of silicon may therefore be 0.01 to 0.3 mass % in the present embodiment.

<Silver: 0.01 to 0.3 Mass %>

Silver is an element having a function of high strengthening when added and solid-solved in copper, and thereafter precipitating finely. With a content of silver of less than 0.01 mass %, precipitation hardening cannot be expected and a yield stress is insufficient, and a content of silver more than 0.3 mass % not only results in saturation of the effect but also causes an increase in cost. The content of silver may therefore be 0.01 to 0.3 mass % in the present embodiment.

<Nickel: 0.1 to 1.0 Mass %>

Nickel is an element having a function of high strengthening when added and solid-solved in copper, and thereafter precipitating finely. With a content of nickel of less than 0.1 mass %, precipitation hardening cannot be expected and a yield stress is insufficient, and with a content of nickel of more than 1.0 mass %, it is difficult to keep the electrical conductivity at greater than or equal to 50% IACS. The content of nickel may therefore be 0.1 to 1.0 mass % in the present embodiment.

<Balance: Copper and Inevitable Impurities>

The balance, other than the components described above, is copper and inevitable impurities. The term inevitable impurities herein refers to impurities at a content level at which the impurities are inevitably contained in a manufacturing process. The inevitable impurities can be a factor in decreasing the electrical conductivity depending on contents of the inevitable impurities, and it thus may be preferable to suppress the contents of the inevitable impurities factoring in a decrease in electrical conductivity.

[Method for Manufacturing Conductors]

In a method for manufacturing the above-described conductors, the conductors are manufactured by the steps of [1] melting and casting, [2] hot working, [3] cold working, [4] heat treatment, and [5] finishing. For example, in a case of a slit manufacturing method, the conductors are manufactured by the steps of [1-1] melting and casting, [2-1] hot rolling, [3-1] cold rolling, [4-1] heat treatment, and [5-1] finishing rolling, and when these steps are steps for manufacturing strips, slit rolling is performed to obtain a desired width, so as to prepare a plurality of conductors each preferably having a cross-sectional area of 0.75 mm$^2$ or smaller, preferably 0.02 mm$^2$ or smaller. Note that, processes A, B, and D in Examples have common conditions for two processes of [1-1] melting and casting and [2-1] hot rolling, and have different conditions for the subsequent three processes of [3-1] cold rolling, [4-1] heat treatment, and [5-1] finishing rolling.

[1-1] Melting and Casting

In the melting and casting, an ingot having a thickness of 150 mm to 180 mm is manufactured by adjusting amounts of the components so as to prepare the copper alloy composition described above, and melting the components.

[2-1] Hot Rolling

Next, the ingot produced in the above step is subjected to hot rolling at 600 to 1000° C. so as to be manufactured into a plate having a thickness of 10 mm to 20 mm.

[3-1] Cold Rolling

Furthermore, the plate after hot rolling treatment is subjected to cold rolling so as to be manufactured into a conductor having a thickness of 0.02 mm to 1.2 mm. After the cold-rolling step, any heat treatment can be performed before heat treatment to be described below.

[4-1] Heat Treatment

Next, the conductor may be subjected to heat treatment under heat treatment conditions including a heating temperature of 250 to 600° C. and a heating duration of 10 minutes to 5 hours. The objective of the heat treatment differs between compositions. In a case of a solid-solution alloy, the objective is recrystallization, and in a case of a precipitation alloy, the objective is aging heat treatment for causing a predetermined compound to precipitate.

When the copper alloy is a Cu—Cr—Mg-based alloy containing 0.06 to 0.14 mass % of magnesium and 0.225 to 0.3 mass % of chromium, with the balance comprising or consisting of copper and the inevitable impurity, the above heat treatment step is preferably an aging heat treatment step that is performed at a heating temperature of 400 to 550° C. and for a heating duration of 1 hour to 6 hours. When the heating temperature falls within a range of 400 to 550° C., it is possible to obtain a preferable precipitation distribution state, and when the heating duration falls within a range of 1 hour to 6 hours, it is possible to avoid a poor precipitation resulting from a shorter duration, and to prevent a decrease in a volume productivity resulting from a longer duration.

[5-1] Finishing Rolling

Subsequently, the conductor subjected to the above heat treatment is subjected to finishing rolling so as to be manufactured into a conductor having a width of 0.1 mm to 15 mm, and a thickness of 0.02 mm to 0.05 mm. A rolling reduction of the finishing rolling (the rate of reduction in thickness) is 20 to 97%.

When the copper alloy is a Cu—Cr—Mg-based alloy containing 0.06 to 0.14 mass % of magnesium and 0.225 to 0.3 mass % of chromium, with the balance comprising or consisting of copper and the inevitable impurity, the rolling reduction of the finishing rolling (the rate of reduction in thickness) is preferably 50 to 97%. When the rolling reduction of the finishing rolling falls within a range of 50 to 97%, it is possible to achieve a 0.2% yield stress of 600 MPa or higher and an electrical conductivity of greater than or equal to 70% IACS in the Cu—Cr—Mg-based alloy containing the above components.

[Other Methods for Manufacturing Conductor]

The above-described conductor can be manufactured by manufacturing methods other than the slit manufacturing method described above. For example, in a case of a round-wire rolling technique, the hot rolling and the cold rolling of the above processes of [1-1] to [5-1] are replaced with hot drawing and cold drawing, respectively, so that a conductor is manufactured through processes of [1-2] melting and casting, [2-2] hot drawing, [3-2] cold drawing, [4-2] heat treatment, and [5-2] finishing rolling, and the slit rolling in a final step is dispensed with. Alternatively, cold rolling may be added between the cold drawing and the heat treatment, so that the conductor is manufactured through processes of [1-3] melting and casting, [2-3] hot drawing, [3-3] cold drawing, cold rolling, [4-3] heat treatment, and [5-3] finishing rolling. In a case of a solid-solution alloy, the heat treatment can be performed any plurality of times in the above other manufacturing methods. As seen from the above, methods for manufacturing the conductor are not limited as long as the properties and the like of the conductor are within the ranges described in the present disclosure.

[Method for Manufacturing Flat Cable]

In a method for manufacturing a flat cable according to the present embodiment, a predetermined number of the conductors manufactured by the above method, which has a width-direction cross-sectional area of 0.75 mm$^2$ or smaller, preferably 0.02 mm$^2$ or smaller, may be prepared. Then, insulating films are disposed on both sides of a principal surface of each of the predetermined number of the conductors, and the above predetermined number of the conductors are sandwiched by a pair of insulating films with an adhesive interposed therebetween, with a predetermined tension given to the predetermined number of the conductors. A laminating process is then performed by pressing a laminated body including the predetermined number of the conductors, the adhesive, and the pair of insulating films.

[Properties of Flat Cable and Conductor]

In the flat cable according to the present embodiment, when the bending radius given is within a range of 4 mm to 8 mm, the conductors satisfy $Y \geq 14.175X^2 - 249.35X + 1406.9$, where X (mm) denotes a bending radius, Y (MPa) denotes a 0.2% yield stress, and have an electrical conductivity of greater than or equal to 50% IACS. For example, when the bending radius is 8 mm, the 0.2% yield stress of the conductors satisfies greater than or equal to 319.3 MPa. With the 0.2% yield stress and the electrical conductivity at values within the respective ranges, it is possible to keep an electrical conductivity that is equivalent to electrical conductivities of conductors of the related art, at such a level that has no influence on a product, and to improve an elasticity, providing a good bending property. Preferably, an elongation of the conductors is less than 5%. With the elongation within the above range, it is possible to improve a bending property, increasing a lifetime of the conductors even with a smaller radius.

A quadratic inequality relationship between the 0.2% yield stress (Y) and the bending radius (X) of the conductors is derived from a finding that a numeric value that provides a bending life of more than 300000 times can be expressed in terms of 0.2% yield stress with a thickness of 0.035 mm and a specified bending radius X, at any test temperature within a range from a room temperature to 150° C. Coefficients of the above quadratic inequality: a=14.175, b=249.35, and c=1406.9 are results obtained by mathematizing an indication of the finding that a mechanical strength of 83% or higher of the 0.2% yield stress significantly increases the bending life, which allows the conductor to endure 300000 times of bending test. This inequality holds true for not only 0.035 mm but also 0.02 mm to 0.05 mm.

The lower-limit value of the range of the 0.2% yield stress according to the present disclosure may be 319.3 MPa, assuming that the bending radius is 8 mm. The 0.2% yield stress in the present disclosure is therefore greater than or equal to 319.3 MPa, preferably greater than or equal to 600 MPa. Additionally, in the copper alloy according to the present disclosure for which a range of the composition is limited, it is assumed that the 0.2% yield stress does not exceed 750 MPa even if each strengthening mechanism has contributed to a maximum extent. The 0.2% yield stress in the present disclosure is therefore less than or equal to 750 MPa. It should be noted that in a case where the objectives described above can be met or are not required, an upper limit value of the range of the 0.2% yield stress may not be limited.

In the flat cable of the present embodiment, the conductors may have small cross-sectional areas, and thus a high electrical conductivity may be required. A criterion for being high electrical conductivity is not fixed. For example, as a movable range of a steering wheel is increased, an overall length of the cable becomes longer and the electric resistance increases, and as the bending radius becomes smaller, the overall length becomes shorter and the electric resistance decreases. In addition, in a case of decreasing thicknesses of the conductors so as to prolong the lifetime, or decreasing widths of the conductors so as to increase the number of channels, the cross-sectional areas are decreased and the electric resistance increases. In addition, since electric resistances of metals including copper increase with a temperature rise, a required level of electrical conductivity increases when a requirement for durable temperature increases. As described above, an electrical conductivity desired for the conductors is to change depending on the design of the conductors. However, as a rough indication, the electrical conductivity of the conductors is required to be greater than or equal to 50% IACS, preferably greater than or equal to 70% IACS. When the conductors have an electrical conductivity satisfying a preferable range of greater than or equal to 70% IACS, the conductors are considered to be suitable conductors that increase a degree of freedom of design.

According to the above embodiment, it is possible to exert a sufficient elasticity to achieve further improvement in the bending property while maintaining a high electrical conductivity at a level that can be applied to product specifications. In addition, when the bending radius is made smaller by 1 mm, an outer diameter of a rotatable connector device can be made smaller by 4 mm, which means that the outer diameter of the rotatable connector device can be made four times as small as the bending radius. This effect allows an outer diameter of a steering column housing the rotatable connector device to be made smaller without changing an inner diameter of the connector, which allows a driver to have a wider visual field in a depth direction when the driver sits in a driver's seat of a vehicle. In addition, a space on laps of the driver is extended, thus improving comfortability of driving.

In addition, having a good bending property while maintaining a high electrical conductivity allows narrowing of the conductors that was not possible to achieve with tough pitch coppers of the related art, and it is thus possible to increase the number of disposed conductors, that is, the number of channels when a flat cable having the same width as a flat cable of the related art is manufactured. In addition, in a case of making a flat cable have the same number of channels as a flat cable of the related art, it is possible to decrease the width of the flat cable than that of the flat cable of the related art, which makes it possible to achieve a reduction in thickness and profile of the rotatable connector device.

In the case of a flat cable with the same number of channels as a flat cable of the related art, it is possible to provide a highly convenient flat cable capable of supporting multifunction of a vehicle. In addition, in a case of providing a plurality of flat cables in a rotatable connector device, since the number of channels per flat cable increases, the number of the flat cables to be housed in a rotatable connector device can be reduced.

EXAMPLES

Hereinafter, Examples of the present disclosure will be described in detail.

First, tin, magnesium, chromium, zinc, titanium, zirconium, iron, phosphorus, silicon, silver, and nickel were prepared so as to be at contents shown in Table 1, and ingots that were made of copper alloys (Alloy No. 1 to No. 20) having respective alloy compositions and each have a thickness of 150 mm to 180 mm, were manufactured by a casting machine. Next, the ingots were subjected to hot rolling at 600 to 1000° C. so as to be manufactured into plates each having a thickness of 20 mm, and were thereafter subjected to cold rolling.

After undergoing the above common steps, the plates were subjected to aging heat treatment in a process A, as shown in Table 2, at a treatment temperature of any one of 400° C., 425° C., and 450° C., for a treatment time period of either 30 minutes or 2 hours, and were thereafter subjected to finishing rolling at a rolling reduction of 19%, resulting in conductors each having a thickness of 0.035 mm.

In a process B, as shown in Table 3, the plates were subjected to aging heat treatment at a treatment temperature of any one of 400° C., 425° C., 450° C., and 500° C., for a treatment time period of either 30 minutes or 2 hours, and were thereafter subjected to rolling processing at a rolling reduction of either 90% or 77%, resulting in conductors each having a thickness of 0.035 mm. The thickness of the conductors as finished products was the same in the processes A and B.

Furthermore, in a process C, which was for comparison, as shown in Table 4, the plates subjected to the hot rolling and having a thickness of 20 mm were subjected to cold rolling, resulting in conductors each having a thickness of 0.035 mm, and the conductors were thereafter subjected to aging heat treatment at a treatment temperature of any one of 200° C., 350° C., 375° C., 400° C., 450° C., 700° C., 750° C., 800° C., and 900° C., for a treatment time period of any one of 15 seconds, 30 minutes, and 2 hours.

Strips subjected to processes of the heat treatment and the rolling were cut to have a desired width by slit rolling. Since a crack which has occurred and propagated in a conductor causes a lifetime of a flat cable to terminate, a conductor having a larger width has a longer life. Within the range of 0.3 mm to 15 mm defined in the present disclosure, a test was conducted on a conductor of a 0.3 mm width, having a shortest life, and wider conductors of a 0.5 mm width and a 0.8 mm width. In this range, variations in lifetime between conductor widths were small and thus determination results of the lifetime test did not differ depending on differences in width dimensions. Therefore, results for the conductor of 0.8 mm width are shown as representative results For the manufactured conductors, properties including 0.2% yield stress, electrical conductivity (EC), elongation, and bending life, as well as grain size before the finishing rolling were measured by the following method.

(A) 0.2% Yield Stress

A tension test was conducted with test conditions conforming to JIS Z 2241 and a rolling direction taken as a longitudinal direction.

(B) Electrical Conductivity (EC)

As a criterion for electric resistance (or electrical conductivity), an electrical conductivity of a standard annealed soft copper at 20° C. (volume resistivity: $1.7241 \times 10^{-2}$ μΩ·m), which is internationally adopted, was determined as 100% IACS. Electrical conductivities of materials are generally known, where a pure copper (tough pitch copper, oxygen-free copper) has an electrical conductivity of EC=100% IACS, and Cu-0.15Sn and Cu-0.3Cr each have an electrical conductivity of EC=about 85% IACS. Here, EC is an abbreviation for "Electrical Conductivity", and IACS stands for "International Annealed Copper Standard".

Meanwhile, conductive properties of the conductors vary depending on manufacture processes. For example, comparing the process A and the process B in the present embodiment, the process B resulted in a relatively degraded conductive property due to a difference in an amount of finishing rolling. As to electric resistances of the materials in the Examples, an electric resistance of greater than or equal to 70% IACS was determined to be very good, "⊙", meaning that the conductor played an adequate role in a supposed environment or an equivalent range of design, an electric resistance of 50 to 70% IACS was determined to be good, "○", meaning that the conductor had a sufficient product property in some usage environments or SRC structures, and an electric resistance less than 50% IACS was determined to be poor, "x", meaning that the conductor was unsuitable.

(C) Elongation

A tension test was conducted with test conditions conforming to JIS Z 2241, in a longitudinal direction of the conductors, and elongations after fracture was measured. When an elongation of a conductor in a measurement result is less than 5%, a lifetime of the conductor can be prolonged, which enables, for example, the range of design to be expanded, and therefore measured values are shown explicitly. By improving a property of elongation, even if an electrical conductivity is sacrificed to some extent and made lower than electrical conductivities of conductors of the related art to some extent, it is possible to further improve the bending property and, depending on a performance balance, the conductor will be a conductor suitable for a flat cable used in a rotatable connector device.

(D) Grain Size Before Finishing Rolling

On cross sections in two directions, i.e., a width direction and a thickness direction, test samples were embedded in a resin, mirror polished, and subjected to intergranular corrosion using an etchant such as a chromic acid, such that the test samples are in a state where a grain size can be sufficiently determined when observed with an optical microscope or an electron microscope, and the grain size was measured in conformity with the intercept method of JIS H 0501. The number of measurements were 30 to 100, and an average diameter value per grain was determined.

(E) Bending Life

Using an FPC bending tester (from Ueshima Seisakusho Co., Ltd., apparatus name: FT-2130), on a sample fixing plate and a movable plate, after cutting a conductor into a length of 100 mm, two of the cut conductors were bridged so as to be energizable with one end being adhered to a movable-plate side and another end being bent in a vertical direction with a desired diameter. The other end was further fixed on a fixing plate side, both free ends were connected to the measuring instrument, and the bending life was determined. When one of the two cut conductors is broken, it becomes impossible to measure voltage, and therefore a time point of the breakage was determined as a lifetime. The test conditions included a test temperature of 20 to 85° C., a bending radius X of radii of 4 mm to 8 mm (7.5 mm, 6.3 mm, 5.5 mm, and 4.7 mm), a stroke of ±13 mm, and a rotation speed of 180 rpm. A case where the number of bendings was 300000 or more at a time when a voltage became impossible to measure was determined to be good, "0", meaning that a fatigue property required for a rotatable connector is satisfied, and a case where the number of bendings was less than 300000 was determined to be poor, "x". Results of the measurement and evaluations by the above method are shown in Tables 2 to 4.

TABLE 1

| ALLOY No. | ALLOY COMPOSITION (mass %) | | | | | | | | | | |
|---|---|---|---|---|---|---|---|---|---|---|---|
| | Sn | Mg | Cr | Zn | Ti | Zr | Fe | P | Si | Ag | Ni |
| 1 | 0.15 | | | | | | | | | | |
| 2 | 0.3 | | | | | | | | | | |
| 3 | 0.7 | | | | | | | | | | |
| 4 | 0.25 | | | 0.3 | 0.15 | | | | | | |
| 5 | | 0.1 | 0.3 | | | | | | | | |
| 6 | 0.8 | | 0.3 | 0.5 | | | | | | | |
| 7 | | | | | | 0.1 | | | | | |
| 8 | | | 0.3 | | | 0.1 | | | 0.02 | | |
| 9 | | | 0.3 | | 0.1 | | | | 0.02 | | |
| 10 | | | 0.5 | | 0.06 | | 0.08 | | 0.03 | 0.2 | |
| 11 | | | | 0.12 | | | 2.3 | 0.03 | | | |
| 12 | | 0.7 | | | | | | 0.005 | | | |
| 13 | | | | 0.1 | | | 0.1 | 0.13 | | | 0.7 |
| 14 | | | | | | | 2.25 | | 0.02 | | |
| 15 | | | | | | | 0.1 | 0.003 | | | |
| 16 | | 0.13 | | | | | 0.22 | 0.1 | | | |
| 17 | 0.07 | | | | | | 0.2 | 0.06 | | | 0.15 |
| 18 | | | | | | | | | | | |
| 19 | *10* | | | | | | | | | | |
| 20 | | | | *30* | | | | | | | |

Note 1)
Underlined and italic values in the table indicate that the values are out of the respective ranges of the present disclosure.
Note 2)
No. 18 shows pure copper containing no added elements but Cu.

TABLE 2

| ALLOY No. | DETAILED MANUFACTURING METHOD | PROCESS A ROLLING REDUCTION IN FINISHING ROLLING (%) | 0.2% YIELD STRESS (MPa) | ELECTRICAL CONDUCTIVITY (% IACS) | ELONGATION (%) | GRAIN SIZE BEFORE FINISHING ROLLING (μm) | CRITICAL BENDING RADIUS (mm) | BENDING LIFE FOR EACH BENDING RADIUS | | | | ELECTRIC RESISTANCE |
|---|---|---|---|---|---|---|---|---|---|---|---|---|
| | | | | | | | | 7.5 (mm) | 6.3 (mm) | 6.5 (mm) | 4.7 (mm) | |
| 1 | COLD ROLLING INTO 0.043 mm THICKNESS → HEAT TREATMENT AT 400° C. FOR 30 min → FINISHING ROLLING INTO 0.035 mm THICKNESS | 19 | 400 | 85 | 25 | 7 | 6.3 | ○ | ○ | X | X | ⊛ |
| 2 | COLD ROLLING INTO 0.043 mm THICKNESS → HEAT TREATMENT AT 400° C. FOR 30 min → FINISHING ROLLING INTO 0.035 mm THICKNESS | 19 | 430 | 75 | 22 | 5 | 5.9 | ○ | ○ | X | X | ⊛ |
| 3 | COLD ROLLING INTO 0.043 mm THICKNESS → HEAT TREATMENT AT 400° C. FOR 30 min → FINISHING ROLLING INTO 0.035 mm THICKNESS | 19 | 450 | 63 | 20 | 4 | 5.7 | ○ | ○ | ○ | X | ○ |
| 4 | COLD ROLLING INTO 0.043 mm THICKNESS → HEAT TREATMENT AT 425° C. FOR 2 h → FINISHING ROLLING INTO 0.035 mm THICKNESS | 19 | 500 | 75 | 20 | 3 | 5.1 | ○ | ○ | X | X | ⊛ |
| 5 | COLD ROLLING INTO 0.043 mm THICKNESS → HEAT TREATMENT AT 450° C. FOR 2 h → FINISHING ROLLING INTO 0.035 mm THICKNESS | 19 | 520 | 85 | 20 | — | 4.9 | ○ | ○ | ○ | X | ⊛ |
| 6 | COLD ROLLING INTO 0.043 mm THICKNESS → HEAT TREATMENT AT 450° C. FOR 2 h → FINISHING ROLLING INTO 0.035 mm THICKNESS | 19 | 490 | 55 | 20 | — | 5.2 | ○ | ○ | ○ | X | ○ |
| 7 | COLD ROLLING INTO 0.043 mm THICKNESS → HEAT TREATMENT AT 450° C. FOR 2 h → FINISHING ROLLING INTO 0.035 mm THICKNESS | 19 | 530 | 90 | 20 | — | 4.9 | ○ | ○ | ○ | X | ⊛ |
| 8 | COLD ROLLING INTO 0.043 mm THICKNESS → HEAT TREATMENT AT 450° C. FOR 2 h → FINISHING ROLLING INTO 0.035 mm THICKNESS | 19 | 530 | 78 | 20 | — | 4.9 | ○ | ○ | ○ | X | ⊛ |
| 9 | COLD ROLLING INTO 0.043 mm THICKNESS → HEAT TREATMENT AT 450° C. FOR 2 h → FINISHING ROLLING INTO 0.035 mm THICKNESS | 19 | 520 | 78 | 20 | — | 4.9 | ○ | ○ | ○ | X | ⊚ |
| 10 | COLD ROLLING INTO 0.043 mm THICKNESS → HEAT TREATMENT AT 450° C. FOR 2 h → FINISHING ROLLING INTO 0.035 mm THICKNESS | 18 | 540 | 78 | 20 | — | 4.6 | ○ | ○ | ○ | X | ⊚ |
| 11 | COLD ROLLING INTO 0.043 mm THICKNESS → HEAT TREATMENT AT 450° C. FOR 2 h → FINISHING ROLLING INTO 0.035 mm THICKNESS | 19 | 540 | 60 | 20 | — | 4.8 | ○ | ○ | ○ | X | ○ |
| 12 | COLD ROLLING INTO 0.043 mm THICKNESS → HEAT TREATMENT AT 450° C. FOR 30 min → FINISHING ROLLING INTO 0.035 mm THICKNESS | 19 | 460 | 60 | 21 | 10 | 5.3 | ○ | ○ | ○ | X | ○ |
| 13 | COLD ROLLING INTO 0.043 mm THICKNESS → HEAT TREATMENT AT 450° C. FOR 30 min → FINISHING ROLLING INTO 0.035 mm THICKNESS | 19 | 460 | 75 | 22 | 10 | 5.5 | ○ | ○ | ○ | X | ⊛ |
| 14 | COLD ROLLING INTO 0.043 mm THICKNESS → HEAT TREATMENT AT 450° C. FOR 2 h → FINISHING ROLLING INTO 0.035 mm THICKNESS | 19 | 550 | 60 | 20 | — | 4.7 | ○ | ○ | ○ | ○ | ○ |

TABLE 2-continued

| | PROCESS A | | | | | | BENDING LIFE FOR EACH BENDING RADIUS | | | |
|---|---|---|---|---|---|---|---|---|---|---|
| ALLOY No. | DETAILED MANUFACTURING METHOD | ROLLING REDUCTION IN FINISHING ROLLING (%) | 0.2% YIELD STRESS (MPa) | ELECTRICAL CONDUCTIVITY (% IACS) | ELONGATION (%) | GRAIN SIZE BEFORE FINISHING ROLLING (μm) | CRITICAL BENDING RADIUS (mm) | 7.5 (mm) | 6.3 (mm) | 6.5 (mm) | 4.7 (mm) | ELECTRIC RESISTANCE |
| 15 | COLD ROLLING INTO 0.043 mm THICKNESS → HEAT TREATMENT AT 400° C. FOR 30 min → FINISHING ROLLING INTO 0.035 mm THICKNESS | 19 | 430 | 90 | 21 | 10 | 5.9 | ○ | ○ | X | X | ◡ |
| 16 | COLD ROLLING INTO 0.043 mm THICKNESS → HEAT TREATMENT AT 400° C. FOR 30 min → FINISHING ROLLING INTO 0.035 mm THICKNESS | 19 | 460 | 80 | 22 | 8 | 5.5 | ○ | ○ | ○ | X | ◡ |
| 17 | COLD ROLLING INTO 0.043 mm THICKNESS → HEAT TREATMENT AT 450° C. FOR 2 h → FINISHING ROLLING INTO 0.035 mm THICKNESS | 19 | 470 | 78 | 22 | 10 | 5.4 | ○ | ○ | ○ | X | ◡ |
| 18 | COLD ROLLING INTO 0.043 mm THICKNESS → HEAT TREATMENT AT 200° C. FOR 30 min → FINISHING ROLLING INTO 0.035 mm THICKNESS | 19 | 320 | 99 | 18 | 12 | 8.0 | X | X | X | X | ○ |
| 19 | COLD ROLLING INTO 0.043 mm THICKNESS → HEAT TREATMENT AT 500° C. FOR 30 min → FINISHING ROLLING INTO 0.035 mm THICKNESS | 19 | 730 | *10* | 8 | 4 | 3.4 | ○ | ○ | ○ | ○ | X |
| 20 | COLD ROLLING INTO 0.043 mm THICKNESS → HEAT TREATMENT AT 450° C. FOR 30 min → FINISHING ROLLING INTO 0.035 mm THICKNESS | 19 | 660 | *30* | 7 | 4 | 3.7 | ○ | ○ | ○ | ○ | X |

Note 1)
Underlined and italic values in the table indicate that the values are out of the respective ranges of the present disclosure.

Note 2)
The symbol "—" in the table indicates that the measurement was impossible because the microstructure was a worked microstructure (heavily rolled microstructure).

TABLE 3

| ALLOY No. | DETAILED MANUFACTURING METHOD | PROCESS B ROLLING REDUCTION IN FINISHING ROLLING (%) | 0.2% YIELD STRESS (MPa) | ELECTRICAL CONDUCTIVITY (% IACS) | ELONGATION (%) | GRAIN SIZE BEFORE FINISHING ROLLING (μm) | CRITICAL BENDING RADIUS (mm) | BENDING LIFE FOR EACH BENDING RADIUS 7.5 (mm) | 6.3 (mm) | 6.5 (mm) | 4.7 (mm) | ELECTRIC RESISTANCE |
|---|---|---|---|---|---|---|---|---|---|---|---|---|
| 1 | COLD ROLLING INTO 0.35 mm THICKNESS → HEAT TREATMENT AT 400° C. FOR 30 min → FINISHING ROLLING INTO 0.035 mm THICKNESS | 50 | 510 | 80 | 3 | 7 | 5.0 | ○ | ○ | ○ | X | * |
| 2 | COLD ROLLING INTO 0.35 mm THICKNESS → HEAT TREATMENT AT 400° C. FOR 30 min → FINISHING ROLLING INTO 0.035 mm THICKNESS | 90 | 550 | 70 | 2 | 5 | 4.7 | ○ | ○ | ○ | ○ | * |
| 3 | COLD ROLLING INTO 0.35 mm THICKNESS → HEAT TREATMENT AT 400° C. FOR 20 min → FINISHING ROLLING INTO 0.035 mm THICKNESS | 90 | 590 | 58 | 1 | 4 | 4.4 | ○ | ○ | ○ | ○ | ○ |
| 4 | COLD ROLLING INTO 0.15 mm THICKNESS → HEAT TREATMENT AT 425° C. FOR 2 h → FINISHING ROLLING INTO 0.035 mm THICKNESS | 77 | 640 | 66 | 1 | 3 | 4.0 | ○ | ○ | ○ | ○ | ○ |
| 5 | COLD ROLLING INTO 0.15 mm THICKNESS → HEAT TREATMENT AT 450° C. FOR 2 h → FINISHING ROLLING INTO 0.035 mm THICKNESS | 77 | 635 | 72 | 1 | — | 4.0 | ○ | ○ | ○ | ○ | * |
| 6 | COLD ROLLING INTO 0.15 mm THICKNESS → HEAT TREATMENT AT 450° C. FOR 2 h → FINISHING ROLLING INTO 0.035 mm THICKNESS | 77 | 690 | 50 | 1 | — | 3.6 | ○ | ○ | ○ | ○ | ○ |
| 7 | COLD ROLLING INTO 0.35 mm THICKNESS → HEAT TREATMENT AT 450° C. FOR 2 h → FINISHING ROLLING INTO 0.035 mm THICKNESS | 90 | 850 | 85 | 2 | — | 4.7 | ○ | ○ | ○ | ○ | * |
| 8 | COLD ROLLING INTO 0.15 mm THICKNESS → HEAT TREATMENT AT 450° C. FOR 2 h → FINISHING ROLLING INTO 0.035 mm THICKNESS | 77 | 640 | 72 | 2 | — | 4.0 | ○ | ○ | ○ | ○ | * |
| 9 | COLD ROLLING INTO 0.15 mm THICKNESS → HEAT TREATMENT AT 450° C. FOR 2 h → FINISHING ROLLING INTO 0.035 mm THICKNESS | 77 | 640 | 72 | 1 | — | 4.0 | ○ | ○ | ○ | ○ | * |
| 10 | COLD ROLLING INTO 0.15 mm THICKNESS → HEAT TREATMENT AT 450° C. FOR 2 h → FINISHING ROLLING INTO 0.035 mm THICKNESS | 77 | 850 | 52 | 1 | — | 3.9 | ○ | ○ | ○ | ○ | ○ |
| 11 | COLD ROLLING INTO 0.35 mm THICKNESS → HEAT TREATMENT AT 450° C. FOR 2 h → FINISHING ROLLING INTO 0.035 mm THICKNESS | 90 | 650 | 55 | 1 | 10 | 3.8 | ○ | ○ | ○ | ○ | ○ |
| 12 | COLD ROLLING INTO 0.35 mm THICKNESS → HEAT TREATMENT AT 450° C. FOR 20 min → FINISHING ROLLING INTO 0.035 mm THICKNESS | 90 | 670 | 65 | 1 | 10 | 4.3 | ○ | ○ | ○ | ○ | ○ |
| 13 | COLD ROLLING INTO 0.35 mm THICKNESS → HEAT TREATMENT AT 400° C. FOR 30 min → FINISHING ROLLING INTO 0.035 mm THICKNESS | 90 | 600 | 65 | 1 | — | 3.9 | ○ | ○ | ○ | ○ | ○ |
| 14 | COLD ROLLING INTO 0.35 mm THICKNESS → HEAT TREATMENT AT 450° C. FOR 2 h → FINISHING ROLLING INTO 0.035 mm THICKNESS | 90 | 650 | 65 | 1 | — | 3.9 | ○ | ○ | ○ | ○ | ○ |

TABLE 3-continued

| | | PROCESS B | | | | | | | BENDING LIFE FOR EACH BENDING RADIUS | | | |
|---|---|---|---|---|---|---|---|---|---|---|---|---|
| ALLOY No. | DETAILED MANUFACTURING METHOD | ROLLING REDUCTION IN FINISHING ROLLING (%) | 0.2% YIELD STRESS (MPa) | ELECTRICAL CONDUCTIVITY (% IACS) | ELONGATION (%) | GRAIN SIZE BEFORE FINISHING ROLLING (μm) | CRITICAL BENDING RADIUS (mm) | 7.5 (mm) | 6.3 (mm) | 6.5 (mm) | 4.7 (mm) | ELECTRIC RESISTANCE |
| 15 | COLD ROLLING INTO 0.35 mm THICKNESS → HEAT TREATMENT AT 400° C. FOR 20 min → FINISHING ROLLING INTO 0.035 mm THICKNESS | 90 | 530 | 82 | 2 | 10 | 4.9 | ○ | ○ | ○ | X | * |
| 16 | COLD ROLLING INTO 0.35 mm THICKNESS → HEAT TREATMENT AT 400° C. FOR 30 min → FINISHING ROLLING INTO 0.035 mm THICKNESS | 90 | 520 | 75 | 2 | 8 | 4.9 | ○ | ○ | ○ | X | * |
| 17 | COLD ROLLING INTO 0.35 mm THICKNESS → HEAT TREATMENT AT 450° C. FOR 2 h → FINISHING ROLLING INTO 0.035 mm THICKNESS | 90 | 570 | 70 | 2 | 12 | 4.5 | ○ | ○ | ○ | ○ | * |

Note)
The symbol "*" in the table indicates that the measurement was impossible because the microstructure was a worked microstructure (heavily rolled microstructure).

TABLE 4

| | | PROCESS C | | | | BENDING | | | | |
| | | 0.2% YIELD STRESS (MPa) | ELECTRICAL CONDUC- TIVITY (% IACS) | ELON- GATION (%) | GRAIN SIZE (μm) | LIFE FOR EACH BENDING RADIUS | | | | ELECTRIC RESISTANCE |
| ALLOY No. | DETAILED MANUFACTURING METHOD | | | | | 7.5 (mm) | 6.3 (mm) | 6.5 (mm) | 4.7 (mm) | |
| --- | --- | --- | --- | --- | --- | --- | --- | --- | --- | --- |
| 1 | COLD ROLLING INTO 0.035 mm THICKNESS → HEAT TREATMENT AT 350° C. FOR 30 min | *150* | 86 | 35 | 7 | ○ | ○ | X | X | ⊛ |
| 2 | COLD ROLLING INTO 0.035 mm THICKNESS → HEAT TREATMENT AT 350° C. FOR 30 min | *180* | 77 | 33 | 6 | ○ | ○ | X | X | ⊛ |
| 3 | COLD ROLLING INTO 0.035 mm THICKNESS → HEAT TREATMENT AT 375° C. FOR 30 min | *200* | 65 | 32 | 5 | ○ | ○ | X | X | ○ |
| 4 | COLD ROLLING INTO 0.035 mm THICKNESS → HEAT TREATMENT AT 200° C. FOR 2 h | 650 | *45* | 5 | — | ○ | ○ | ○ | ○ | X |
| 5 | COLD ROLLING INTO 0.035 mm THICKNESS → HEAT TREATMENT AT 900° C. FOR 15 s | *200* | *40* | 25 | 12 | ○ | ○ | X | X | X |
| 6 | COLD ROLLING INTO 0.035 mm THICKNESS → HEAT TREATMENT AT 750° C. FOR 2 h | *250* | *45* | 25 | 20 | ○ | X | X | X | X |
| 7 | COLD ROLLING INTO 0.035 mm THICKNESS → HEAT TREATMENT AT 600° C. FOR 2 h | *130* | 70 | 25 | 35 | ○ | X | X | X | ⊛ |
| 8 | COLD ROLLING INTO 0.035 mm THICKNESS → HEAT TREATMENT AT 900° C. FOR 5 s | *250* | *45* | 20 | 15 | ○ | ○ | X | X | X |
| 9 | COLD ROLLING INTO 0.035 mm THICKNESS → HEAT TREATMENT AT 750° C. FOR 2 h | *230* | *40* | 25 | 25 | ○ | X | X | X | X |
| 10 | COLD ROLLING INTO 0.035 mm THICKNESS → HEAT TREATMENT AT 750° C. FOR 2 h | *260* | *35* | 25 | 15 | ○ | X | X | X | X |
| 11 | COLD ROLLING INTO 0.035 mm THICKNESS → HEAT TREATMENT AT 800° C. FOR 2 h | *150* | *35* | 25 | 35 | ○ | X | X | X | X |
| 12 | COLD ROLLING INTO 0.035 mm THICKNESS → HEAT TREATMENT AT 450° C. FOR 30 min | *200* | 82 | 15 | 15 | ○ | ○ | X | X | ○ |
| 13 | COLD ROLLING INTO 0.035 mm THICKNESS → HEAT TREATMENT AT 400° C. FOR 30 min | *150* | 77 | 33 | 10 | ○ | ○ | X | X | ○ |
| 14 | COLD ROLLING INTO 0.035 mm THICKNESS → HEAT TREATMENT AT 750° C. FOR 2 h | *140* | *40* | 30 | 35 | X | X | X | X | X |
| 15 | COLD ROLLING INTO 0.035 mm THICKNESS → HEAT TREATMENT AT 400° C. FOR 30 min | *150* | 91 | 35 | 12 | ○ | ○ | X | X | ⊛ |
| 16 | COLD ROLLING INTO 0.035 mm THICKNESS → HEAT TREATMENT AT 375° C. FOR 30 min | *150* | 81 | 33 | 7 | ○ | ○ | X | X | ⊛ |
| 17 | COLD ROLLING INTO 0.035 mm THICKNESS → HEAT TREATMENT AT 700° C. FOR 2 h | *180* | 80 | 30 | 35 | X | X | X | X | ⊛ |

Note 1)
Underlined and italic values in the table indicate that the values are out of the respective ranges of the present disclosure.

Note 2)
The symbol "—" In the table indicates that the measurement was impossible because the microstructure was a worked microstructure (heavily rolled microstucture.

According to the results shown in Table 2, in each of Alloy No. 1 to No. 17, alloy components were within the respective ranges according to the present disclosure and by being subjected to the process A, both of the 0.2% yield stress and the electrical conductivity were good. In addition, it is understood that, by undergoing the process A, for at least bending radii of 6.3 mm and 7.5 mm within a range of 4 mm to 8 mm, the fatigue property (bending life) required for a flat cable of a rotatable connector device was sufficiently satisfied, and the bending property was good. Critical bending radius shown in the table refers to a calculation value calculated from the 0.2% yield stress using the following formula (1).

$$X = (249.35 - (249.35^2 - 4 \times 14.175 \times (1406.9 - Y))^{0.5})/(2 \times 14.175) \quad (1),$$

where
X denotes the critical bending radius (in millimeter), and
Y denotes the 0.2% yield stress (in MPa).

According to a correlation between experimental results and calculation values of the critical bending radius, it can be confirmed that the critical bending radius calculated using the above formula (1) serves as an index for checking whether a bending life of a flat cable is sufficient. Therefore, if a more severe bending radius is required within the range of bending radius of 4 mm to 8 mm, the critical bending radius is calculated from the 0.2% yield stress using the above formula (1), and based on the calculated critical bending radius, an appropriate alloy and process can be selected. In addition, a bending radius greater than or equal to a calculation value obtained from the above formula (1) makes a bending life of a flat cable better.

Furthermore, the above formula (1) is rearranged to isolate Y, so as to be converted into the following formula.

$$Y=14.175X^2-249.35X+1406.9 \quad (2)$$

That is, when a value of a minimum bending radius assumed based on a specific bending radius according to specifications and the like is known, use of the above formula (2) with the minimum bending radius regarded as the critical bending radius allows a value of the 0.2% yield stress providing a sufficient fatigue property (bending life) at the critical bending radius to be determined. In addition, a flat cable having a 0.2% yield stress higher than the calculation value obtained from the above formula (2) provides a better bending life.

Meanwhile, in each of Alloy No. 18 to No. 20, where alloy components are out of the respective ranges according to the present disclosure, even if processes similar to those for Alloy No. 1 to No. 17 were applied, one or both properties of the electrical conductivity and the elongation were insufficient, and it is understood that the conductors are not suitable as a conductor for a rotatable connector device.

In addition, from the results shown in Table 3, it is understood that by making the finishing rolling ratio higher (in the process B: from 0.35 mm thickness or 0.15 mm thickness to 0.035 mm thickness) than the finishing rolling ratio in the test shown in Table 2 and increasing the yield stress, thus making the critical bending radius smaller and the elongation less than 5%, a sufficient fatigue property is exhibited for a wider range of bending radius. There is a difference in performance as a conductor depending on the type of alloy. For example, in Alloy No. 1, the bending performance improved while the electrical conductivity was kept at greater than or equal to 70% IACS, and the range of bending radius in which the bending life was sufficient was widened. Meanwhile, for example, in Alloy No. 4, although the range of bending radius in which the bending life was sufficient was widened, the electrical conductivity was below 70% IACS, and there was a trade-off relationship. Making use of a type of alloy having such a trade-off relationship may result in either a proper conductor or an improper conductor depending on a balance with a design aspect, but in a case where the electrical conductivity is acceptable, a design of further reducing a diameter of the connector is possible, and such type of alloy is highly useful.

The results shown in Table 4 are results of prototypes that were subjected to the process C, which is unsuitable. In particular, in each of Alloy No. 1 to No. 17, it is understood that alloy components were within the respective ranges according to the present disclosure, whereas the electrical conductivity was insufficient because the alloy was subjected to a process providing an insufficient 0.2% yield stress without being subjected to the finishing rolling, or a precipitation alloy was not subjected to the aging treatment, or the aging treatment was performed at an inappropriate temperature. Therefore, in the processes according to the present disclosure, it is important for a solid-solution alloy to subject grains to refining treatment as much as possible in the heat treatment and to be subjected to the finishing rolling, and it is important for a precipitation alloy to be subjected to the aging heat treatment to have an appropriate electrical conductivity and similarly subjected to the finishing rolling. In some cases, it is suitable to perform the heat treatment on a precipitation alloy in a form of overaging treatment rather than performing the heat treatment up to an aging peak, due to a tradeoff between a balance of 0.2% yield stress and electrical conductivity exerted by an alloy, and a connector design.

In particular, in comparison with the related art, in a case of controlling alloy components and a grain size as in Japanese Patent No. 3633302, at least the contents of Sn and Mg are out of the respective range according to the present disclosure in the Examples, which is considered not to satisfy the inequality presented herein because of a strengthening range. In addition, as is clear by comparing Alloy No. 1 to No. 3 shown in Table 3 and Table 4 in the present Example, it cannot be said that properties possessed by the alloys having the compositions were sufficiently exploited by only controlling the grain size. Similarly, within component ranges such as component ranges described in Japanese Patent No. 4734695, since most of Examples and Reference Examples resulted in tensile strengths of about 380 MPa, it is considered that the 0.2% yield stress does not satisfy 319.3 MPa or higher within a range of bending radius of 4.7 mm to 7.5 mm, and a in a sole Example in which the tensile strength was 500 MPa, the content of Ag was 2 wt %, which is out of the range according to the present disclosure. In addition, as is understood by comparing Alloy No. 1 shown in Table 2 and Table 3 in the present Example, which had components closest to the Examples described in Japanese Patent No. 4734695, it can be said that it is suitable to use the alloys as high-yield stress materials having elongations less than 5%, rather than making the elongation greater than or equal to 5%.

(F) Evaluation of Elasticity

By the same manufacturing methods as the process A shown in Table 2, conductors that were respectively made of copper alloys Alloy No. 1 to No. 20 were manufactured, and the conductors were each sandwiched with composite materials made of a PET plastic and an adhesive (from Riken Technos Corporation, flexible flat cables for airbag (insulating films), resin thickness of 25 μm, adhesive thickness of 20 μm), each subjected to laminating process by pressing the conductor from both sides, to be manufactured into flat cables. Conditions of the laminating process included a pressing temperature of 165° C., a pressing time period of 3 minutes, and a pressing pressure of 0.5 MPa. Rotatable connector device illustrated in FIG. 1 were assembled so that bending radii of the manufactured flat cables were 4 mm to 8 mm (7.5 mm, 6.3 mm, 5.5 mm, and 4.7 mm). Then, each of the connectors was subjected to a rotation test at 85° C., 1000000 times, using a rotation endurance tester (from Furukawa Automotive Systems Inc., slide bending tester).

It is considered here that a reduction width in yield stress threshold at occurrence of plastic deformation is small when a reduction width in the 0.2% yield stress is small before and after the rotation test, and conversely, when the reduction width in 0.2% yield stress is large, permanent deformation is likely to occur, so that the elasticity is lost. Thus, after the rotation test, the resin and the adhesive were dissolved using a solution such as a cresol, a conductor body is taken out and thereafter subjected to a tension test. In a case where the 0.2% yield stress was 80% or higher of the 0.2% yield stress before the use, the conductor body was determined to be good, "○", meaning that the conductor kept a sufficient strength and was sufficient in elasticity. In a case where the 0.2% yield stress was 60% or higher and lower than 80% of the 0.2% yield stress before the use, the conductor body was determined to be substantially good, "Δ". In a case where the 0.2% yield stress was lower than 60% of the 0.2% yield stress before the use, the conductor body was determined to be poor, "x", meaning that the elasticity of the conductor body was not good. Results of the evaluation are shown in Table 5.

TABLE 5

| ALLOY No. | DETAILED MANUFACTURING METHOD | PROCESS A ROLLING REDUCTION IN FINISHING ROLLING (%) | 0.2% YIELD STRESS (MPa) | ELECTRICAL CONDUCTIVITY (% IACS) | ELONGATION (%) | CRITICAL BENDING RADIUS (mm) | ELASTICITY AFTER ROTATION TEST FOR EACH BENDING RADIUS | | | |
|---|---|---|---|---|---|---|---|---|---|---|
| | | | | | | | 7.5 (mm) | 6.5 (mm) | 6.3 (mm) | 4.7 (mm) |
| 1 | COLD ROLLING INTO 0.043 mm THICKNESS → HEAT TREATMENT AT 400° C. FOR 30 min → FINISHING ROLLING INTO 0.035 mm THICKNESS | 19 | 400 | 85 | 25 | 6.3 | ○ | ○ | X | X |
| 2 | COLD ROLLING INTO 0.043 mm THICKNESS → HEAT TREATMENT AT 400° C. FOR 30 min → FINISHING ROLLING INTO 0.035 mm THICKNESS | 19 | 430 | 75 | 22 | 5.9 | ○ | ○ | X | X |
| 3 | COLD ROLLING INTO 0.043 mm THICKNESS → HEAT TREATMENT AT 400° C. FOR 30 min → FINISHING ROLLING INTO 0.035 mm THICKNESS | 19 | 450 | 63 | 20 | 5.7 | ○ | X | ○ | X |
| 4 | COLD ROLLING INTO 0.043 mm THICKNESS → HEAT TREATMENT AT 425° C. FOR 2 h → FINISHING ROLLING INTO 0.035 mm THICKNESS | 19 | 500 | 75 | 20 | 5.1 | ○ | ○ | ○ | X |
| 5 | COLD ROLLING INTO 0.043 mm THICKNESS → HEAT TREATMENT AT 450° C. FOR 2 h → FINISHING ROLLING INTO 0.035 mm THICKNESS | 19 | 520 | 85 | 20 | 4.9 | ○ | ○ | ○ | X |
| 6 | COLD ROLLING INTO 0.043 mm THICKNESS → HEAT TREATMENT AT 450° C. FOR 2 h → FINISHING ROLLING INTO 0.035 mm THICKNESS | 19 | 490 | 55 | 20 | 5.2 | ○ | ○ | ○ | X |
| 7 | COLD ROLLING INTO 0.043 mm THICKNESS → HEAT TREATMENT AT 450° C. FOR 2 h → FINISHING ROLLING INTO 0.035 mm THICKNESS | 19 | 530 | 90 | 20 | 4.9 | ○ | ○ | ○ | X |
| 8 | COLD ROLLING INTO 0.043 mm THICKNESS → HEAT TREATMENT AT 450° C. FOR 30 min → FINISHING ROLLING INTO 0.035 mm THICKNESS | 19 | 530 | 76 | 20 | 4.8 | ○ | ○ | ○ | X |
| 9 | COLD ROLLING INTO 0.043 mm THICKNESS → HEAT TREATMENT AT 450° C. FOR 2 h → FINISHING ROLLING INTO 0.035 mm THICKNESS | 19 | 520 | 76 | 20 | 4.8 | ○ | ○ | ○ | X |
| 10 | COLD ROLLING INTO 0.043 mm THICKNESS → HEAT TREATMENT AT 450° C. FOR 2 h → FINISHING ROLLING INTO 0.035 mm THICKNESS | 19 | 540 | 78 | 20 | 4.8 | ○ | ○ | ○ | X |
| 11 | COLD ROLLING INTO 0.043 mm THICKNESS → HEAT TREATMENT AT 450° C. FOR 2 h → FINISHING ROLLING INTO 0.035 mm THICKNESS | 19 | 540 | 60 | 21 | 5.3 | ○ | ○ | ○ | X |
| 12 | COLD ROLLING INTO 0.043 mm THICKNESS → HEAT TREATMENT AT 400° C. FOR 30 min → FINISHING ROLLING INTO 0.035 mm THICKNESS | 19 | 480 | 60 | 22 | 5.5 | ○ | ○ | ○ | X |
| 13 | COLD ROLLING INTO 0.043 mm THICKNESS → HEAT TREATMENT AT 400° C. FOR 30 min → FINISHING ROLLING INTO 0.035 mm THICKNESS | 19 | 480 | 75 | 22 | 5.5 | ○ | ○ | ○ | X |
| 14 | COLD ROLLING INTO 0.043 mm THICKNESS → HEAT TREATMENT AT 450° C. FOR 2 h → FINISHING ROLLING INTO 0.035 mm THICKNESS | 19 | 550 | 60 | 20 | 4.7 | ○ | ○ | ○ | ○ |

TABLE 5-continued

| | | PROCESS A | | | | | | ELASTICITY AFTER ROTATION TEST FOR EACH BENDING RADIUS | | | |
|---|---|---|---|---|---|---|---|---|---|---|---|
| ALLOY No. | DETAILED MANUFACTURING METHOD | ROLLING REDUCTION IN FINISHING ROLLING (%) | 0.2% YIELD STRESS (MPa) | ELECTRICAL CONDUCTIVITY (% IACS) | ELONGATION (%) | CRITICAL BENDING RADIUS (mm) | 7.5 (mm) | 6.5 (mm) | 6.3 (mm) | 4.7 (mm) |
| 15 | COLD ROLLING INTO 0.043 mm THICKNESS → HEAT TREATMENT AT 400° C. FOR 30 min → FINISHING ROLLING INTO 0.035 mm THICKNESS | 19 | 430 | 90 | 21 | 5.9 | ○ | ○ | ○ | X |
| 16 | COLD ROLLING INTO 0.043 mm THICKNESS → HEAT TREATMENT AT 400° C. FOR 30 min → FINISHING ROLLING INTO 0.035 mm THICKNESS | 19 | 460 | 80 | 22 | 5.5 | ○ | ○ | X | X |
| 17 | COLD ROLLING INTO 0.043 mm THICKNESS → HEAT TREATMENT AT 450° C. FOR 2 h → FINISHING ROLLING INTO 0.035 mm THICKNESS | 19 | 470 | 76 | 22 | 5.4 | ○ | ○ | ○ | X |
| 18 | COLD ROLLING INTO 0.043 mm THICKNESS → HEAT TREATMENT AT 200° C. FOR 30 min → FINISHING ROLLING INTO 0.035 mm THICKNESS | 19 | 320 | 99 | 18 | 8.0 | X | X | X | X |
| 19 | COLD ROLLING INTO 0.043 mm THICKNESS → HEAT TREATMENT AT 450° C. FOR 30 min → FINISHING ROLLING INTO 0.035 mm THICKNESS | 19 | 720 | *10* | 8 | 3.4 | ○ | ○ | ○ | ○ |
| 20 | COLD ROLLING INTO 0.043 mm THICKNESS → HEAT TREATMENT AT 450° C. FOR 30 min → FINISHING ROLLING INTO 0.035 mm THICKNESS | 19 | 680 | *30* | 7 | 3.7 | ○ | ○ | ○ | ○ |

Note 1)
Underlined and italic values in the table indicate that the values are out of the respective ranges of the present disclosure.

As is clear from Table 5, in all of Alloy No. 1 to No. 17, cases where a bending life was sufficient for at least bending radii of 6.3 mm and 7.5 mm within a range of 4 mm to 8 mm resulted in good elasticities. In addition, a case where the bending life is insufficient in the process A (Alloy No. 18 in Table 2), the elasticity was also poor.

As Cu—Cr—Mg-based alloys, in addition to Alloy No. 5 in Table 1, magnesium and chromium were prepared such that contents are as shown in Table 6, and ingots that are made of copper alloys having respective alloy compositions (Alloy No. 21 to No. 23) and have thicknesses of 150 mm to 180 mm were manufactured using a casting machine. Next, the ingots were subjected to hot rolling at 600 to 1000° C. so as to be manufactured into plates each having a thickness of 20 mm, and were thereafter subjected to cold rolling. The plates were then subjected to aging heat treatment in the process D, as shown in Table 7, at a treatment temperature of 450° C., for a treatment time period of 2 hours, and were thereafter subjected to finishing rolling at a rolling reduction of 75% or 90%, resulting in conductors each having a thickness of 0.035 mm. Then, the properties including 0.2% yield stress, conductivity (EC), elongation, and bending life, as well as grain size before the finishing rolling were measured and the properties were evaluated in the same manner as described above. Results of the evaluation are shown in Table 7.

TABLE 6

| | ALLOY COMPOSITION (mass %) | |
|---|---|---|
| ALLOY No. | Mg | Cr |
| 21 | 0.1 | 0.226 |
| 22 | 0.1 | 0.26 |
| 23 | 0.1 | 0.28 |

TABLE 7

| ALLOY No. | DETAILED MANUFACTURING METHOD | PROCESS D ROLLING REDUCTION IN FINISHING ROLLING (%) | 0.2% YIELD STRESS (MPa) | ELECTRICAL CONDUCTIVITY (% IACS) | ELONGATION (%) |
|---|---|---|---|---|---|
| 21 | COLD ROLLING INTO 0.14 mm THICKNESS → HEAT TREATMENT AT 450° C. FOR 2 h → FINISHING ROLLING INTO 0.035 mm THICKNESS | 75 | 640 | 77 | 2 |
| 22 | COLD ROLLING INTO 0.14 mm THICKNESS → HEAT TREATMENT AT 450° C. FOR 2 h → FINISHING ROLLING INTO 0.035 mm THICKNESS | 75 | 645 | 76 | 2 |
| 22 | COLD ROLLING INTO 0.35 mm THICKNESS → HEAT TREATMENT AT 450° C. FOR 2 h → FINISHING ROLLING INTO 0.035 mm THICKNESS | 90 | 660 | 71 | 1 |
| 23 | COLD ROLLING INTO 0.14 mm THICKNESS → HEAT TREATMENT AT 450° C. FOR 2 h → FINISHING ROLLING INTO 0.035 mm THICKNESS | 75 | 650 | 74 | 2 |

| ALLOY No. | GRAIN SIZE BEFORE FINISHING ROLLING (μm) | CRITICAL BENDING RADIUS (mm) | BENDING LIFE FOR EACH BENDING RADIUS | | | ELECTRIC RESISTANCE |
|---|---|---|---|---|---|---|
| | | | 4.7 (mm) | 4.3 (mm) | 4.0 (mm) | |
| 21 | — | 4.0 | ○ | ○ | ○ | ○ |
| 22 | — | 3.9 | ○ | ○ | ○ | ○ |
| 22 | — | 3.8 | ○ | ○ | ○ | ○ |
| 23 | — | 3.9 | ○ | ○ | ○ | ○ |

Note)
The symbol "—" in the table indicates that the measurement was impossible because the microstructure was a worked microstructure (heavily rolled microstructure).

According to the results shown in Table 7, in each of Alloy No. 21 to No. 23, contents of Mg and Cr in the alloy components are within preferable ranges, and both of the 0.2% yield stress and the electrical conductivity were very good. In addition, it is understood that, by undergoing the process D, the fatigue property (bending life) required for a flat cable of a rotatable connector device was satisfied for bending radii of 4.0 mm, 4.3 mm, and 4.7 mm within a range of 4 mm to 8 mm, and the bending property was very good. In addition, in Alloy No. 22, in a case where the rolling reduction of the finishing rolling was varied, it was understood that, at a rolling reduction of 75%, the critical bending radius was made large, but since the electrical conductivity becomes relatively large, a length of flat cable can be increased and enables a degree of freedom of a design to be improved. In addition, it was understood that, at a rolling reduction of 90%, the electrical conductivity was made relatively low, but since the critical bending radius becomes small, the bending property can be improved with small bending radii within a range of 3.0 mm to 4.0 mm when a required level of the electrical conductivity is not so high.

In addition, by the manufacturing methods similar to the process D shown in Table 7, conductors that respectively comprises or consists of copper alloys Alloy No. 21 to No. 23 were manufactured, and the conductors were each sandwiched with composite materials made of a PET plastic and an adhesive (from Riken Technos Corporation, flexible flat cables for air bag (insulating films), resin thickness of 25 μm, adhesive thickness of 20 μm), each subjected to laminating process by pressing the conductor from both sides, to be manufactured into flat cables. The conditions of the laminating process were the same as the conditions of the laminating process for Alloy No. 1 to No. 20, and rotatable connector device illustrated in FIG. 1 were assembled. For each of the connectors, the elasticity was evaluated in the same manner as described above. Results of the evaluation are shown in Table 8.

TABLE 8

| | | PROCESS D | | | | | ELASTICITY AFTER ROTATION TEST FOR EACH BENDING RADIUS | | |
|---|---|---|---|---|---|---|---|---|---|
| ALLOY No. | DETAILED MANUFACTURING METHOD | ROLLING REDUCTION IN FINISHING ROLLING (%) | 0.2% YIELD STRESS (MPa) | ELECTRICAL CONDUCTIVITY (% IACS) | ELONGATION (%) | CRITICAL BENDING RADIUS (mm) | 4.7 (mm) | 4.3 (mm) | 4.0 (mm) |
| 21 | COLD ROLLING INTO 0.14 mm THICKNESS → HEAT TREATMENT AT 450° C. FOR 2 h → FINISHING ROLLING INTO 0.035 mm THICKNESS | 75 | 640 | 77 | 2 | 4.0 | ○ | ○ | ○ |
| 22 | COLD ROLLING INTO 0.14 mm THICKNESS → HEAT TREATMENT AT 450° C. FOR 2 h → FINISHING ROLLING INTO 0.035 mm THICKNESS | 75 | 645 | 76 | 2 | 3.9 | ○ | ○ | ○ |
| 22 | COLD ROLLING INTO 0.35 mm THICKNESS → HEAT TREATMENT AT 450° C. FOR 2 h → FINISHING ROLLING INTO 0.035 mm THICKNESS | 90 | 660 | 71 | 1 | 3.8 | ○ | ○ | ○ |
| 23 | COLD ROLLING INTO 0.14 mm THICKNESS → HEAT TREATMENT AT 450° C. FOR 2 h → FINISHING ROLLING INTO 0.035 mm THICKNESS | 75 | 650 | 74 | 2 | 3.9 | ○ | ○ | ○ |

According to the results shown in Table 8, in all of Alloy No. 21 to No. 23, cases where a bending life was sufficient for bending radii of 4.0 mm, 4.3 mm, and 4.7 mm within a range of 4 mm to 8 mm resulted in very good elasticities.

What is claimed is:

1. A rotatable connector device comprising:
a stationary member; a rotatable member rotatably attached to the stationary member; and a flat cable housed in an annular space between the stationary member and the rotatable member,
one end of the flat cable being connected to a stationary-side connector that is fixed to the stationary member, another end of the flat cable being connected to a rotating-side connector that is fixed to the rotatable member, the flat cable being provided with a folded-back portion at a middle section in a longitudinal direction of the flat cable, the folded-back portion being bent and folded back,
the flat cable including a predetermined number of one or more conductors each made of a copper alloy and is wound up or rewound with bending kept at the folded-back portion, the conductors each satisfying $Y \geq 14.175X^2 - 249.35X + 1406.9$ within a range of bending radius of 4 mm to 8 mm, where X denotes bending radius, and Y denotes 0.2% yield stress, the conductors each having an electrical conductivity of greater than or equal to 50% IACS, wherein the conductors are each made of a Cu—Cr—Mg-based alloy and the conductors each contains 0.06 to 0.14 mass % of magnesium and 0.225 to 0.3 mass % of chromium, with a balance comprising copper and inevitable impurities, and a rolling reduction of a finishing rolling is 50 to 97%.

2. The rotatable connector device according to claim 1, wherein the conductors each contain one or more of 0.1 to 0.8 mass % of tin, 0.1 to 5.0 mass % of zinc, 0.02 to 0.3 mass % of titanium, 0.01 to 0.2 mass % of zirconium, 0.01 to 3.0 mass % of iron, 0.001 to 0.2 mass % of phosphorus, 0.01 to 0.3 mass % of silicon, 0.01 to 0.3 mass % of silver, and 0.1 to 1.0 mass % of nickel, with a balance comprising copper and inevitable impurities.

3. The rotatable connector device according to claim 1, wherein an elongation of each of the conductors is less than 5%.

4. The rotatable connector device according to claim 1, wherein the conductors each have a width of 0.1 mm to 15 mm and a thickness of 0.02 mm to 0.05 mm.

5. The rotatable connector device according to claim 1, wherein each of the conductors has a 0.2% yield stress of greater than or equal to 600 MPa, and an electrical conductivity of greater than or equal to 70% IACS.

6. The rotatable connector device according to claim 5, wherein the conductors each have a width of 0.3 mm to 0.5 mm and a thickness of 0.030 mm to 0.039 mm, and a bending radius of the flat cable is 4 mm to 5 mm.

\* \* \* \* \*